US012116967B2

(12) United States Patent
Weaver et al.

(10) Patent No.: US 12,116,967 B2
(45) Date of Patent: Oct. 15, 2024

(54) MEASURING A SPARK OF A SPARK PLUG (71) Applicant: Woodward, Inc., Fort Collins, CO (US)

(72) Inventors: Jeffrey S. Weaver, Loveland, CO (US); David C. Petruska, Fort Collins, CO (US)

(73) Assignee: Woodward, Inc., Fort Collins, CO (US)

( * ) Notice: Subject to any disclaimer, the term of this patent is extended or adjusted under 35 U.S.C. 154(b) by 161 days.

(21) Appl. No.: 17/934,451

(22) Filed: Sep. 22, 2022

(65) Prior Publication Data
US 2024/0102437 A1  Mar. 28, 2024

(51) Int. Cl.
*F02P 3/045* (2006.01)
*G01R 19/165* (2006.01)
*H01F 38/12* (2006.01)
*H01T 13/60* (2011.01)

(52) U.S. Cl.
CPC ........ *F02P 3/045* (2013.01); *G01R 19/16576* (2013.01); *H01F 38/12* (2013.01); *H01T 13/60* (2013.01)

(58) Field of Classification Search
CPC ........ F02P 3/045; F02P 3/02; F02P 2017/121; F02P 17/12; G01R 19/16576; H01F 38/12; H01T 13/60
USPC ....................................................... 324/399
See application file for complete search history.

(56) References Cited

U.S. PATENT DOCUMENTS

| | | | |
|---|---|---|---|
| 4,846,129 A * | 7/1989 | Noble | F02P 17/12 123/634 |
| 5,075,627 A | 12/1991 | Bodig et al. | |
| 5,111,790 A * | 5/1992 | Grandy | F02P 13/00 123/654 |
| 5,327,090 A | 7/1994 | Shimasaki et al. | |
| 5,377,652 A * | 1/1995 | Noble | F02P 3/02 123/634 |

(Continued)

FOREIGN PATENT DOCUMENTS

| | | |
|---|---|---|
| EP | 0652573 | 5/1995 |
| EP | 1476648 | 12/2007 |

OTHER PUBLICATIONS

Wheat, Richard David. "An investigation of an electronic ignition system for internal combustion engines." (1949). (Year: 1949).*

(Continued)

*Primary Examiner* — Christopher P McAndrew
(74) *Attorney, Agent, or Firm* — Fish & Richardson P.C.

(57) ABSTRACT

The subject matter of this specification can be embodied in, among other things, an internal combustion engine ignition system includes a voltage divider configured to be coupled to a primary transformer ignition coil connector, the voltage divider configured to reduce a voltage received from the primary transformer ignition coil to a controller voltage, a comparator circuit with an input coupled to an output of the voltage divider, and a controller configured to detect the voltage output of the voltage divider, detect the voltage output of a vehicle electric power supply, detect the voltage output of a comparator, and determine an estimated breakdown voltage of a spark plug based on the detected output voltage of the voltage divider and the detected voltage of the power supply.

21 Claims, 4 Drawing Sheets

(56) References Cited

U.S. PATENT DOCUMENTS

| | | | |
|---|---|---|---|
| 5,438,268 A | 8/1995 | Schleupen et al. | |
| 5,548,220 A * | 8/1996 | Kawamoto | F02P 17/12 |
| | | | 324/378 |
| 8,276,564 B2 | 10/2012 | Petruska | |
| 8,931,457 B2 | 1/2015 | Petruska et al. | |
| 9,013,224 B2 | 4/2015 | Trecarichi et al. | |
| 10,995,726 B2 | 5/2021 | Petruska et al. | |
| 2004/0000878 A1 | 1/2004 | Petruska et al. | |
| 2011/0080174 A1 | 4/2011 | Petruska | |
| 2013/0112674 A1* | 5/2013 | Mnich | B23K 9/095 |
| | | | 219/130.31 |
| 2014/0285032 A1* | 9/2014 | Zannoth | G01R 31/52 |
| | | | 307/130 |
| 2016/0222939 A1* | 8/2016 | Tang | H03K 17/0828 |
| 2018/0306163 A1 | 10/2018 | Rezaei et al. | |

OTHER PUBLICATIONS

International Search Report and Written Opinion in International Application No. PCT/US2023/033281, mailed on Feb. 27, 2024, 15 pages.

NXP, "Automotive Engine Control IC—MC33810," Freescale Semiconductor, Aug. 2014, 40 pages.

NXP.com [online], "Automotive Engine Control IC," Jun. 25, 2021, retrieved on Feb. 8, 2023, retrieved from URL <https://www.nxp.com/products/power-management/smart-switches-and-drivers/low-side-switches/automotive-engine-control-ic:MC33810#:~:text=The%20NXP%C2%AE%20MC33810%20is,%2C%20solenoids%2C%20lamps%2C%20and%20relays>, 6 pages.

* cited by examiner

MEASURING A SPARK OF A SPARK PLUG

TECHNICAL FIELD

This disclosure relates to ignition systems of internal combustion engines.

BACKGROUND

Some reciprocating internal combustion engines operate using a spark ignitor module to ignite an air-fuel ratio within a cylinder. A spark ignitor module operates by building up current in the primary coil of a high-turns ratio transformer, and then interrupting the primary current. This is accomplished by connecting one end of the primary winding to the positive battery voltage. In some implementations, a transistor is used as a switch to tie the other primary terminal to the ground.

SUMMARY

This disclosure relates to measuring a spark of a spark plug.

In an example embodiment, an internal combustion engine ignition system includes a voltage divider configured to be coupled to a primary transformer ignition coil connector, the voltage divider configured to reduce a voltage received from the primary transformer ignition coil to a controller voltage, a comparator circuit with an input coupled to an output of the voltage divider, and a controller configured to detect the voltage output of the voltage divider, detect the voltage output of a vehicle electric power supply, detect the voltage output of a comparator, and determine an estimated breakdown voltage of a spark plug based on the detected output voltage of the voltage divider and the detected voltage of the power supply.

Various embodiments can include some, all, or none of the following features. The controller can be configured to determine an estimated spark duration based on the determined comparator voltage output. The voltage divider can be configured to reduce the voltage by a factor of substantially one hundred. The system can include a blanking circuit coupled to a second input of the comparator, the blanking circuit configured to reduce noise during measurement. The blanking circuit can include a transistor, a resistor electrically coupled to a gate and a leg of the transistor, and a capacitor coupled in parallel to the resistor. The comparator circuit can be a first comparator circuit, the ignition system further comprising a second comparator circuit.

In an example implementation, a method can include measuring a power supply voltage, initiating a dwell for a spark plug, measuring a voltage from an output of a voltage divider coupled to a primary coil, after a duration of time following initiating the dwell, measuring an output of a first voltage comparator comparing the output of the voltage divider to a threshold voltage, and determining an output value of the voltage comparator.

Various implementations can include some, all, or none of the following features. Measuring the output of the voltage comparator can include measuring the integrated voltage output of the voltage comparator for a sufficient duration of time to determine the spark breakdown voltage. The method can include determining the output voltage of the first comparator is above a specified threshold, determining the output voltage of a second comparator is below a specified threshold, and determining that a misfire has occurred based on determining the output of the comparator is above the specified threshold and the output of the second comparator is below a specified threshold. The method can include determining the output voltage of the comparator is below a specified threshold, and determining a presence of a short circuit based on determining the output voltage of the comparator is below a certain threshold. The method can include determining an estimated breakdown voltage of a spark plug based on the determined voltage output of the comparator, and determining an estimated spark duration based on the determined output voltage of the first comparator. Determining an estimated breakdown voltage and an estimated spark duration can include determining a value within a lookup table. Determining an estimated breakdown voltage and an estimated spark duration can include using an empirical function. The method can include changing a spark plug responsive to the determined spark duration and the determined voltage breakdown.

In another example embodiment, an engine system includes an internal combustion engine, and an ignition system coupled to the internal combustion engine, the ignition system including an electric power supply, a primary transformer coil, a secondary transformer coil coupled to the primary transformer coil, a voltage divider coupled to the primary transformer coil, the voltage divider configured to reduce the voltage to a controller voltage, a comparator circuit coupled to an output of the voltage divider, and a controller configured to detect the voltage output of the voltage divider, detect the voltage output of the electric power supply, detect the voltage output of a comparator, and determine an estimated spark duration based on the determined comparator voltage output.

Various embodiments can include some, all, or none of the following features. The controller can be configured to determine an estimated breakdown voltage of a spark plug based on the detected output voltage of the voltage divider and the detected voltage of the electric power supply. The engine system can include a blanking circuit coupled to a second input of the comparator. The blanking circuit can include a transistor, a resistor electrically coupled to a gate and a leg of the transistor, and a capacitor coupled in parallel to the resistor. The comparator circuit can be a first integrator circuit, the ignition system further comprising a second comparator circuit. The voltage divider can be configured to reduce the voltage by a factor of substantially one hundred. The electric power supply can include a battery.

The details of one or more implementations are set forth in the accompanying drawings and the description below. Other features, objects, and advantages will be apparent from the description and drawings, and from the claims.

DESCRIPTION OF DRAWINGS

Like reference symbols in the various drawings indicate like elements.

DETAILED DESCRIPTION

During operations, a reciprocating internal combustion engine ignition system fires a spark plug at a desired time to properly ignite an air-fuel mixture in each cylinder. The engine controller often relies upon a knock sensor to inform the controller of ignition problems or thermocouples to measure misfiring cylinders. Such problems are often caused by worn or improperly installed spark plugs.

This disclosure describes monitoring spark plugs directly to troubleshoot potential ignition issues caused by the spark plug and also to provide prognostics to avoid engine misfire. This disclosure describes monitoring spark plugs so that the plugs can be changed out before there is a problem. A voltage divider is configured to be coupled to a primary transformer ignition coil connector. The voltage divider is configured to reduce a voltage received from the primary transformer ignition coil to a level that can be read by the controller. A comparator circuit has an input coupled to an output of the voltage divider. The controller is configured to detect the voltage output of the voltage divider, the voltage output of a vehicle, or engine, electric power supply, and the voltage output of a comparator. The controller is then configured to determine an estimated breakdown voltage of a spark plug based on a comparator's time response to the detected output voltage of the voltage divider and the detected voltage of the battery. The controller is also configured to determine an estimated spark duration based on a second comparator's time response. These parameters can be used to determine the health of a spark plug during engine operations.

Figure 1:
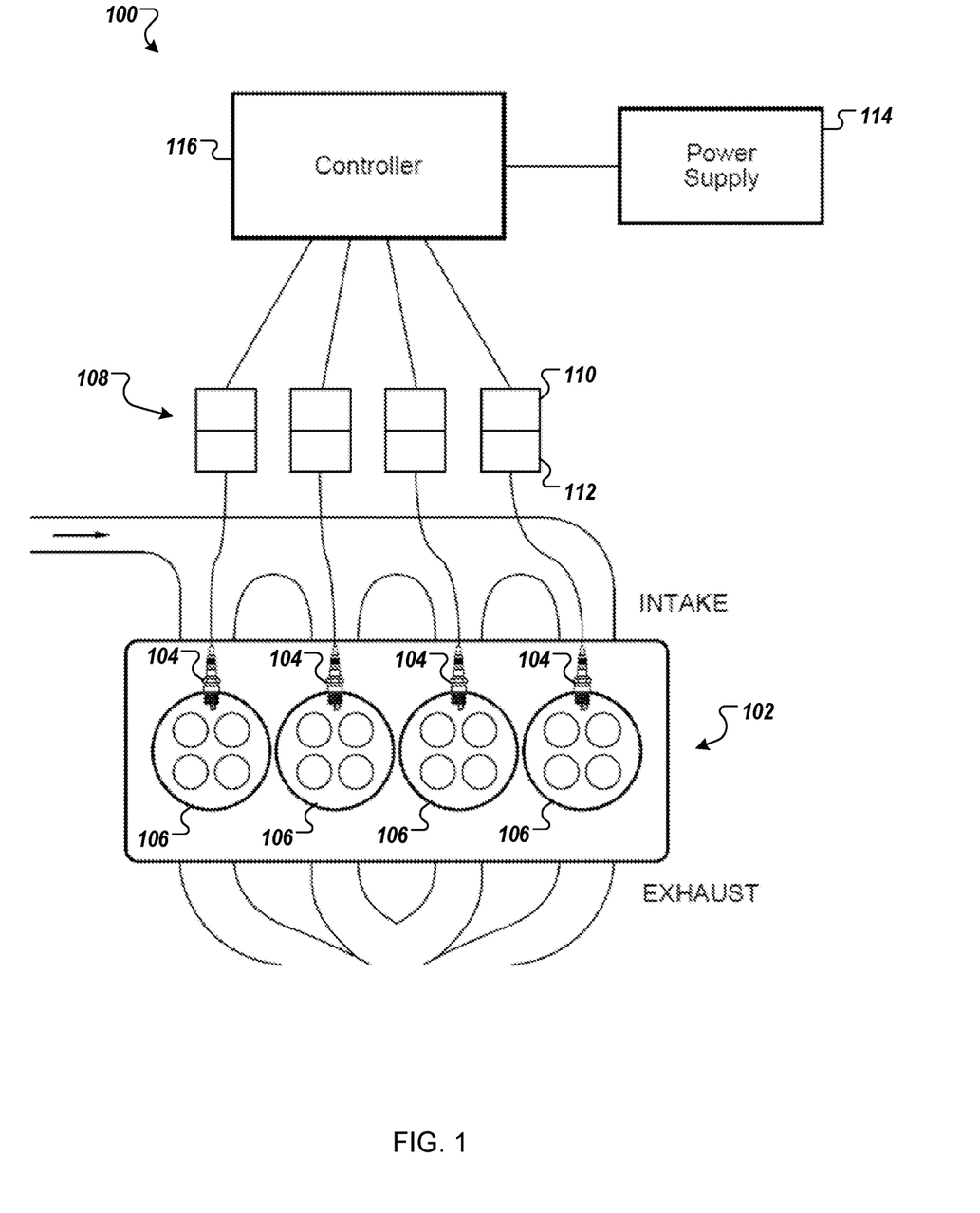
FIG. 1 is a schematic diagram of an example internal combustion engine system.

FIG. 1 is a schematic diagram of an example internal combustion engine system 100. The internal combustion system 100 includes an internal combustion engine 102 that uses spark ignition. The ignition system 100 includes a spark plug 104 within each cylinder 106. Each spark plug 104 is electrically coupled to a coil pack 108. While illustrated and described as having a coil pack 108, other configurations can be used without departing from this disclosure. For example, a single coil pack 108 can be used. Each coil pack 108 includes a primary ignition coil 110 and a secondary ignition coil 112. The primary ignition coil 110 is selectively coupled directly to a power supply 114 by a low side switch in controller 116. During operation, the controller 116 switch closes which then applies the power supply or battery potential across the primary coil. A current within the primary ignition coil 110 then increases linearly with time. This charging of the primary ignition coil 110 is termed the Dwell time. When the controller removes the applied voltage, the energy stored in the primary ignition coil 110 is transferred to the secondary ignition coil by magnetic coupling as a very high voltage (i.e. 10-40 kilovolts). This high voltage ionizes an air gap in the spark plug 104. Once the air gap is ionized and an electric arc is established, the voltage across the secondary ignition coil 112 is lowered significantly. The electrical discharge is maintained until the energy in the secondary ignition coil 112 is dissipated by the spark and the primary ignition coil voltage returns to the power supply voltage.

In some implementations, the power supply 114 can include a battery or super capacitor. Additional power regulation, generation, and conditioning components can be used within the power supply as well, for example, an alternator can be used to recharge a battery. Alternatively or in addition, smoothing capacitors can be used to reduce voltage and current fluctuations in the system.

Figure 2:
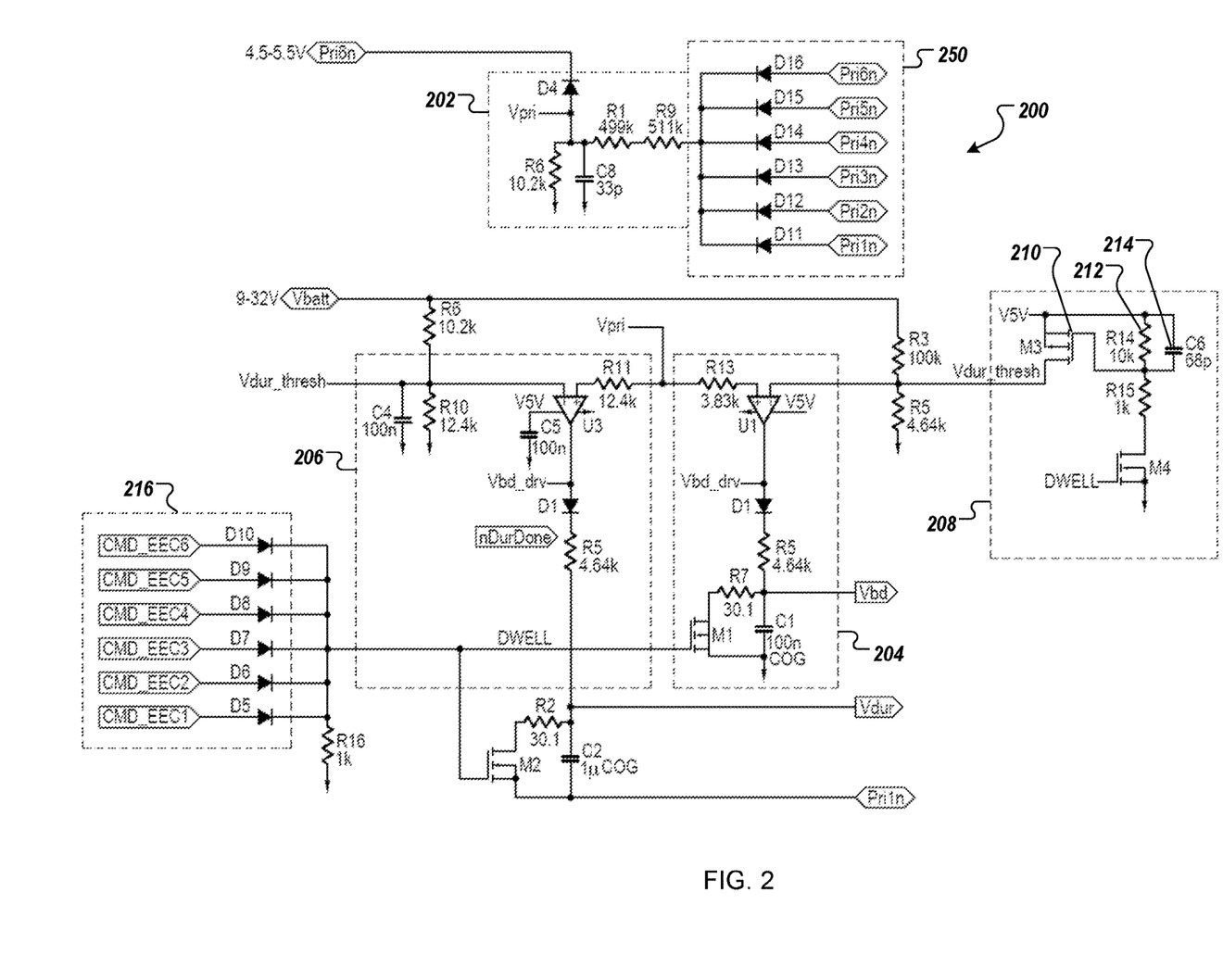
FIG. 2 is a partial wiring diagram of an example internal combustion engine ignition system.

FIG. 2 is a wiring diagram of an example circuit 200 for the diagnostics and prognostics portion of an internal combustion engine ignition system 100. A voltage divider 202 is configured to be coupled to a primary ignition coil connector 250. The voltage divider 202 is configured to reduce a voltage received from the primary ignition coil 110 to a controller voltage, that is, a level that can be read by the controller 116, designated "Vpri" in the illustrated implementation. For example, the voltage divider can reduce the voltage by a factor of one hundred. The controller voltage can range from a two volt input to a thirty-six volt input. Other controller voltages can be used without departing from this disclosure.

A first comparator circuit 204 has an input coupled to an output of the voltage divider 202. In the illustrated implementation, this connection is Vpri. In some implementations, a second comparator circuit 206 is also coupled to the output of the voltage divider 202. The first comparator circuit 204 compares the voltage at Vpri to a predetermined threshold voltage designated "Vbd_thresh". The second comparator circuit compares the voltage at Vpri to a second predetermined threshold voltage designated "Vdur_thresh". In some implementations, the second threshold voltage is different from the first threshold voltage.

In some implementations, a blanking circuit 208 modifying Vbd_thresh is coupled to the second input of the first comparator 204. In some implementations, the blanking circuit 208 includes a transistor 210, a resistor 212 electrically coupled to a gate and a leg of the transistor 210 (to set the bias voltage), and a capacitor 214 coupled in parallel to the resistor (to set the blanking time). The blanking circuit 208 is configured to reduce noise during measurement, for example, by blanking for a set duration of time when ringing (i.e., high frequency oscillation) is likely to be present. Such a time for blanking, in some instances, is two to five microseconds. This blanking behavior is shown by the vbd_thresh trace in FIG. 3 for the illustrated implementation. In some implementations, additional components, such as an additional transistor, resistor, or capacitor, can be included in the blanking circuit.

During operation, voltage Vpri at the output of the voltage divider is detected. In addition, a voltage output of the electric power supply (e.g., a battery), is measured. Finally, an integrated output voltage of the first comparator 204 (designated "vbd") and second comparator 206 (designated "vdur") is also detected. Based on these measurements, a breakdown voltage of a spark plug 104 and a spark duration of a spark plug 104 can be determined. In some implementations, the breakdown voltage of the spark plug can be determined from the detected output voltage of the voltage divider and the detected voltage of the power supply. In some implementations, the estimated spark duration can be determined from the average voltage output of the second comparator 206. In some implementations, such determinations can be determined by the controller 116.

The following is a description of the illustrated implementation during operations. It should be noted that the following is simply an example operation of the example circuit that can be used with aspects of this disclosure. Minor changes to the circuit or operations described herein may still be covered by this disclosure.

Figure 3:
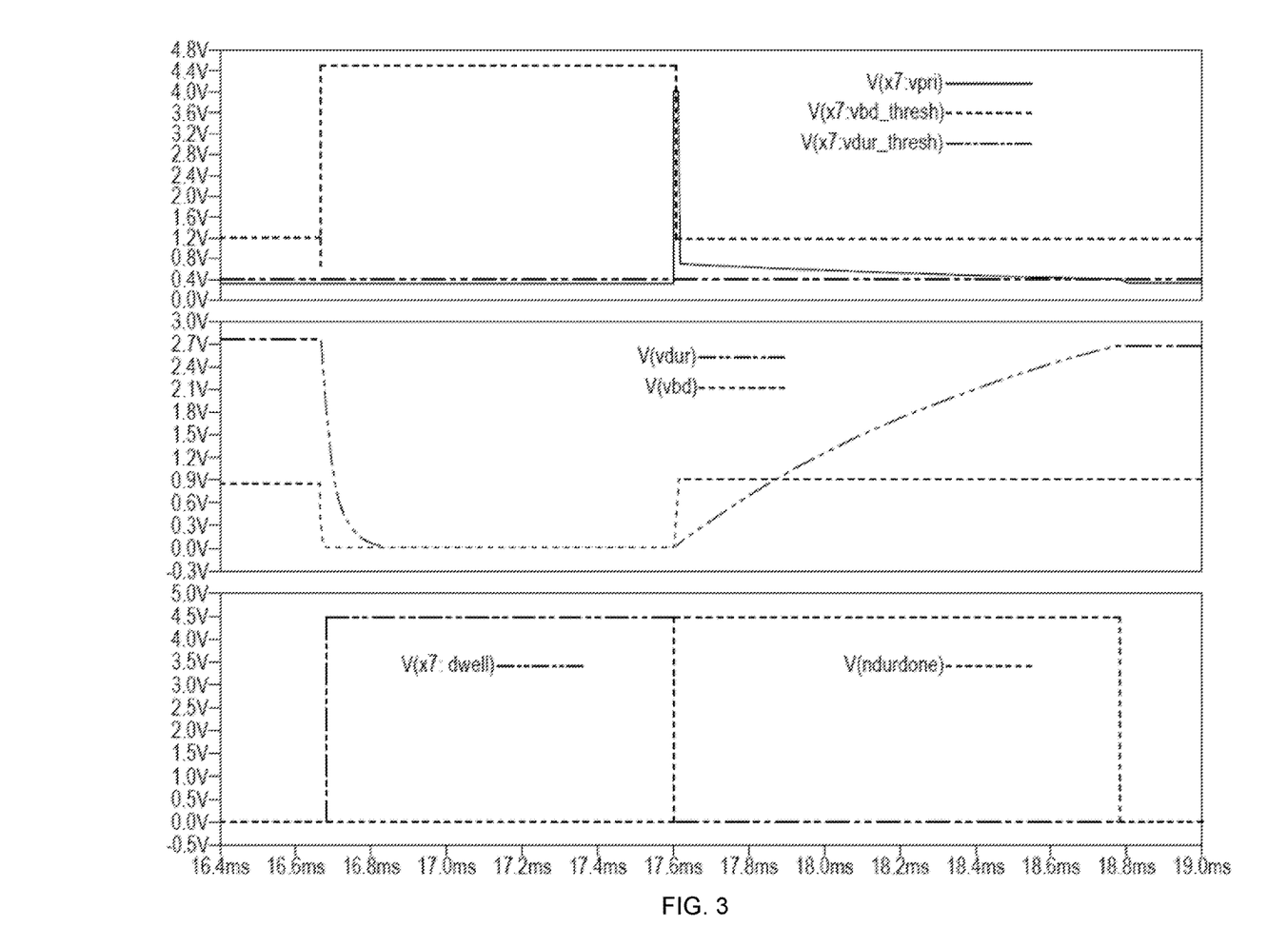
FIG. 3 shows a set of graphs showing examples of measurement signals and timings at various nodes an internal combustion ignition system

When any dwell input (shown as the dwell connectors 216 and designated "dwell" in FIG. 3) is asserted high, the integration capacitors C1 and C2 are discharged by the transistors M1 and M2 within 200 us to substantially 0 V. This is illustrated in FIG. 3 by the plots of the output voltages designated "Vbd" and "Vdur", which represent the desired spark breakdown and duration measurements. This discharge prepares the circuit 200 to integrate the information from the VPri signal (that is, the output voltage of the voltage divider 202).

After the dwell falls, the voltage of the primary ignition coil 110 clamps high for the time needed for the spark plug breakdown voltage to be reached. Vpri follows the same trend at a reduced voltage. The time for the spark plug breakdown voltage to be reached is dependent on several operational parameters, but has been empirically established, for the example circuit 200, to be on the order of ten micro seconds. The primary ignition coils 110 can, in some instances, have parasitic inductance that can result in unpredictable ringing (high frequency oscillations) on the primary ignition coil voltage during the breakdown event and spark duration. The circuit 200 first measures the high-time of the primary ignition coil voltage pulse, which is proportional to the spark breakdown voltage. The first comparator 204 (U1) utilizes a leading-edge blanked threshold. In some implementations, such a threshold is substantially 37% of the power supply (i.e., battery) voltage. In some implementations, an additional two to five microsecond constant offset is subtracted from the leading edge of the Vpri signal using a time-delayed threshold which blanks the integration, by the blanking circuit 208 using transistors M3 (210), and M4 to alter Vbd_thresh. FIG. 3 illustrates this behavior. After this blanking time, C1 integrates the remaining width of the Vpri pulse, producing a readable output voltage minus the blanking interval's contribution to an output of the first comparator circuit 204 (Vbd).

After the initial pulse, the primary ignition coil voltage falls and stays at a value slightly higher than a power supply voltage, potentially with more ringing, until the energy in the primary ignition coil 110 is dissipated and the spark extinguished. After that, the primary coil voltage falls to the power supply driving voltage. The duration of the spark event is integrated by C2 during the time the primary coil voltage is higher than the power supply voltage by more than 12% of the nominal power supply voltage. In some instances, this duration is substantially 1-5 milliseconds, for example, with a dwell of less than 10 amps current through the primary ignition coil 110. During the duration that integration is occurring, the output from the second comparator 206 (nDurDone signal) is approximately 5V. A falling edge of this signal indicates that the measurement is complete.

FIG. 3 is a set of graphs showing examples of voltage and timing measurements of various nodes of the internal combustion ignition system 100. The waveforms illustrated are typical of the operations described herein. The graphs show an overview of the signals and timings involved in the overall measurement process at various nodes of the internal combustion ignition system. The individual waveforms are described and referenced by name in FIG. 2. Each individual graph in FIG. 3 corresponds to a labelled node in FIG. 2

Figure 4:
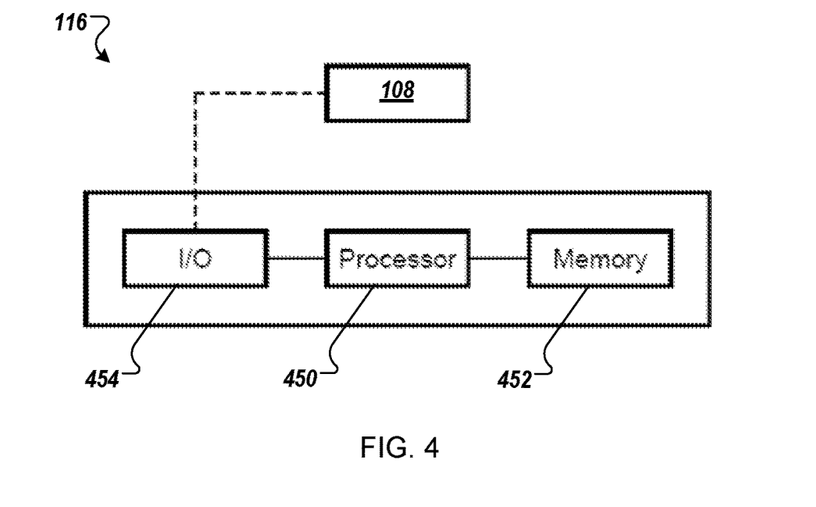
FIG. 4 is a block diagram of an example controller that can be used with aspects of this disclosure.

FIG. 4 is a block diagram of a controller that can be used with aspects of this disclosure. The controller 116 can, among other things, monitor parameters of the system and send signals to actuate and/or adjust various operating parameters of the system. As shown in FIG. 4, the controller 116, in certain instances, includes a processor 450 (e.g., implemented as one processor or multiple processors) and a memory 452 (e.g., implemented as one memory or multiple memories) containing instructions that cause the processors 450 to perform operations described herein. The processors 450 are coupled to an input/output (I/O) interface 454 for sending and receiving communications with components in the system, including, for example, the coil pack 108. In certain instances, the controller 116 can additionally communicate status with and send actuation and/or control signals to one or more of the various system components of the system 100, as well as other sensors (e.g., pressure sensors, temperature sensors, vibration sensors, and other types of sensors) provided in the system 100. In certain instances, the controller can communicate status and send actuation and control signals to one or more of the components within the system 100, such as the coil packs 108. The communications can be hard-wired, wireless, or a combination of wired and wireless. In some implementations, the controller 116 can be a distributed controller with different portions located about a vehicle or site. For example, in certain instances, the controller 116 can be located adjacent to the engine 102, or it can be located in a separate compartment, such as a control room or a passenger cabin. Additional controllers can be used throughout the site or vehicle as stand-alone controllers or networked controllers without departing from this disclosure.

The controller 116 can operate in monitoring, commanding, and using the ignition system 100 for measuring spark duration and breakdown voltage. Input and output signals, including the data from sensors or nodes, controlled and monitored by the controller 116, can be logged continuously by the controller 116.

The controller 116 can have varying levels of autonomy for controlling the ignition system 100. For example, the controller 116 can begin sensing issues with a spark plug, and can alert an operator. Alternatively, the controller 116 can begin sensing issues with a spark plug, receive an additional input from an operator, and begin adjusting ignition operations (for example, changing a cylinder firing order or omitting firing a cylinder) with no other input from an operator. Alternatively, the controller 116 can begin sensing a spark plug issue and adjust the ignition operations with no input from an operator.

Figure 5:
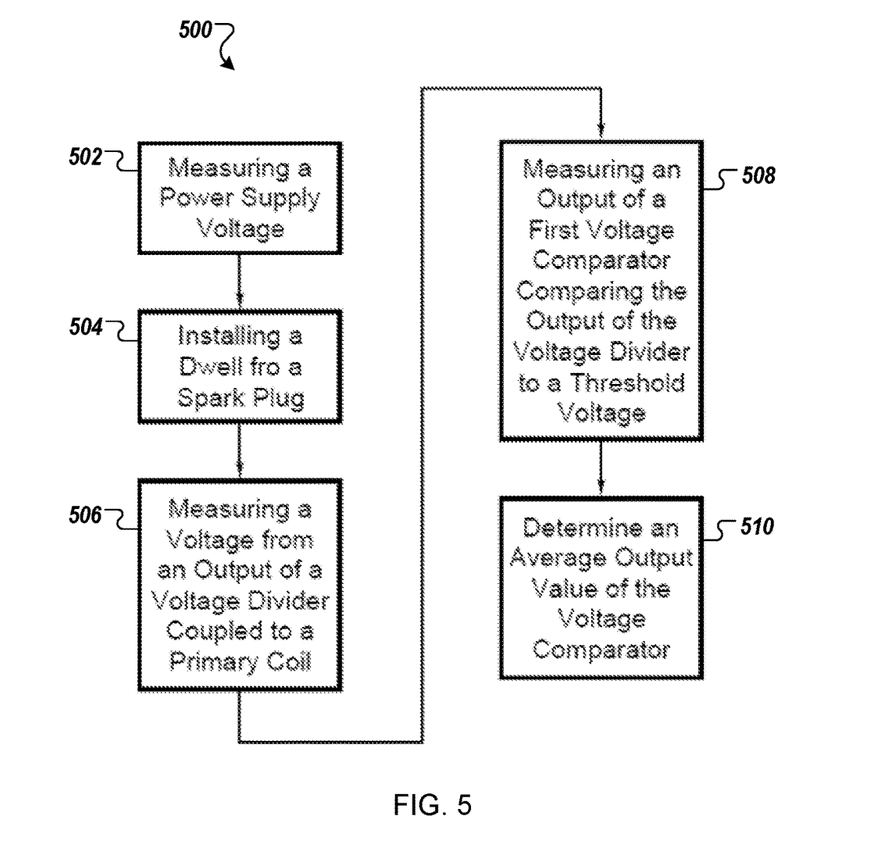
FIG. 5 is a flowchart of an example method that can be used with aspects of this disclosure.

FIG. 5 is a flowchart of an example method 500 that can be used with aspects of this disclosure. In some implementations, all or part of the method 500 can be performed by the controller 116. At 502, a power supply voltage is measured. While primarily described as a battery, other electrical power sources, such as an alternator or a super capacitor, can be used without departing from this disclosure. At 504, a dwell for a spark plug is initiated. That is, power is sent to the coil packs 108 for a duration of time.

At 506, a voltage from an output of a voltage divider coupled to a primary coil is measured, for example, by the controller 116. After a duration of time following initiating the dwell, at 508, an output of a first voltage comparator 204 comparing the output of the voltage divider to a threshold voltage is measured. Measuring the output of the voltage comparator includes measuring the output of the voltage comparator for a sufficient duration of time to determine a falling edge of the dwell. For example, in some instances, twenty-five milliseconds is a sufficient duration.

At 510, an average output value of the first voltage comparator 204 is determined. In some instances, the average voltage output of the voltage comparator 204 is determined to be below a specified threshold, for example, 37% of the nominal power supply voltage. In such an instance, a short circuit is determined to be present based on determining the output voltage of the comparator is below the specified threshold.

In some instances, the average output voltage of the first comparator 204 is determined to be above a specified threshold, for example, 37% above the nominal power supply voltage. In some instances, the average output voltage of the second comparator is determined to be above a specified threshold. For example, in some instances, 12% above the nominal power supply voltage may be used. When both the average voltage of the first comparator is above an empirically determined threshold and the average voltage of the second comparator is below another empirically determined threshold, then a misfire is determined to have occurred based on the average voltage of the first comparator is above the specified threshold and the average voltage of the second comparator is below the specified threshold.

In some implementations, the average output of the first comparator 204 is used to determining an estimated breakdown voltage of a spark plug. Alternatively or in addition, an estimated spark duration is determined based on the determined average output voltage of the second comparator 206. In some implementations, an estimated breakdown voltage and an estimated spark duration are determined by finding the values within a look-up table. In some implementations, such a look-up table can be stored in the memory 452 of the controller 116 (FIG. 4). In some implementations, an estimated breakdown voltage and an estimated spark duration are determined using an empirical function. In instances where the estimated breakdown voltage and estimated spark duration are out of specification for a specific spark plug 104, the specific spark plug can be changed based on the determined spark duration and the determined voltage breakdown being outside of specification.

A number of implementations have been described. Nevertheless, it will be understood that various modifications may be made without departing from the spirit and scope of this disclosure. For example, the systems comprised herein can be applied to an internal combustion engine with two cylinders, three cylinders, four cylinders, five cylinders, six cylinders, eight cylinders, or sixteen cylinders. Accordingly, other implementations are within the scope of the following claims.

What is claimed is:

1. An internal combustion engine ignition system comprising:
a voltage divider configured to be coupled to a primary transformer ignition coil connector, the voltage divider configured to reduce a positive voltage received from the primary transformer ignition coil and provide the reduced positive voltage as a positive controller voltage at a voltage output of the voltage divider; and
a controller configured to:
measure the reduced positive controller voltage output by the voltage divider;
measure a vehicle electric power supply voltage; and
determine an estimated breakdown voltage of a spark plug based on the measured reduced positive controller voltage and the measured vehicle power supply voltage.

2. The system of claim 1, further comprising a comparator circuit with an input coupled to the voltage output of the voltage divider, wherein the controller is further configured to measure a positive voltage output of the comparator circuit and determine an estimated spark duration based on the measured positive voltage output of the comparator circuit.

3. The system of claim 1, wherein the voltage divider is configured to reduce the positive voltage by a factor of one hundred.

4. The system of claim 2, further comprising a blanking circuit coupled to a second input of the comparator circuit, the blanking circuit configured to reduce noise during measurement.

5. The system of claim 4, wherein the blanking circuit comprises:
a transistor;
a resistor electrically coupled to a gate and a leg of the transistor; and
a capacitor coupled in parallel to the resistor.

6. The system of claim 2, wherein the comparator circuit is a first comparator circuit, the internal combustion engine ignition system further comprising a second comparator circuit.

7. A method comprising:
measuring a power supply voltage;
initiating a dwell for a spark plug;
reducing, by a voltage divider coupled to a primary coil, a positive voltage received from the primary coil and provide the reduced positive voltage as a positive controller voltage at a voltage output of the voltage divider;
measuring the reduced positive voltage from the voltage output of the voltage divider;
after a duration of time following initiating the dwell, measuring an output of a first voltage comparator comparing the positive controller voltage to a positive threshold voltage; and
determining an output voltage of the voltage comparator.

8. The method of claim 7, wherein measuring the reduced positive voltage from the output of the voltage divider comprises measuring an integrated voltage output of the voltage divider for a predetermined duration of time to determine a spark breakdown voltage.

9. The method of claim 7, further comprising:
determining the output voltage of the first comparator is above a specified threshold;
determining the output voltage of a second comparator is below a specified threshold; and
determining that a misfire has occurred based on determining the output of the comparator is above the specified threshold and the output of the second comparator is below a specified threshold.

10. The method of claim 7, further comprising:
determining the output voltage of the comparator is below a specified threshold; and
determining a presence of a short circuit based on determining the output voltage of the comparator is below a certain threshold.

11. The method of claim 7, further comprising:
determining an estimated breakdown voltage of a spark plug based on the determined voltage output of the comparator; and
determining an estimated spark duration based on the determined output voltage of the first comparator.

12. The method of claim 11, wherein determining an estimated breakdown voltage and an estimated spark duration comprises determining a value within a lookup table.

13. The method of claim 11, wherein determining an estimated breakdown voltage and an estimated spark duration comprises using an empirical function.

14. The method of claim 11, further comprising changing a spark plug responsive to the determined spark duration and the determined voltage breakdown.

15. An engine system comprising:
an internal combustion engine; and
an ignition system coupled to the internal combustion engine, the ignition system comprising:
an electric power supply;
a primary transformer coil;

a secondary transformer coil coupled to the primary transformer coil;

a voltage divider coupled to the primary transformer coil, the voltage divider configured to reduce a positive coil voltage to a positive controller voltage;

a comparator circuit coupled to a positive voltage output of the voltage divider; and a controller configured to:

measure the reduced positive controller voltage output by the voltage divider;

measure a vehicle electric power supply voltage of the electric power supply;

measure a positive comparator voltage output of the comparator circuit; and determine an estimated spark duration based on an average of the measured positive comparator voltage output.

16. The engine system of claim 15, wherein the controller is further configured to determine an estimated breakdown voltage of a spark plug based on the measured reduced positive voltage output and the detected measured vehicle electric power supply voltage.

17. The engine system of claim 15, further comprising a blanking circuit coupled to a second input of the comparator.

18. The engine system of claim 17, wherein the blanking circuit comprises:

a transistor;

a resistor electrically coupled to a gate and a leg of the transistor; and a capacitor coupled in parallel to the resistor.

19. The engine system of claim 15, wherein the comparator circuit is a first integrator circuit, the ignition system further comprising a second comparator circuit.

20. The system of claim 15, wherein the voltage divider is configured to reduce the positive voltage by a factor of one hundred.

21. The system of claim 15, wherein the electric power supply comprises a battery.

* * * * *

UNITED STATES PATENT AND TRADEMARK OFFICE
CERTIFICATE OF CORRECTION

PATENT NO. : 12,116,967 B2
APPLICATION NO. : 17/934451
DATED : October 15, 2024
INVENTOR(S) : Jeffrey S. Weaver and David C. Petruska Page 1 of 1

It is certified that error appears in the above-identified patent and that said Letters Patent is hereby corrected as shown below:

In the Claims

Column 10, Line 1, Claim 16, delete "detected".

Signed and Sealed this
Fourth Day of February, 2025

Coke Morgan Stewart
*Acting Director of the United States Patent and Trademark Office*